United States Patent [19]
Evers et al.

[11] Patent Number: 5,784,299
[45] Date of Patent: Jul. 21, 1998

[54] METHOD FOR MEASURING ELECTRONIC DEVICES UNDER TEST WITH A NETWORK ANALYZER

[75] Inventors: Christian Evers, Kirchheim; Detlef Behrendt, Grafing; Jochen Simon, Munich, all of Germany; Ulrich L. Rohde, Upper Saddle River, N.J.

[73] Assignees: Rohde & Schwarz GmbH & Co. KG, Munich, Germany; Compact Software, Inc., Paterson, N.J.

[21] Appl. No.: 787,330

[22] Filed: Jan. 28, 1997

[30] Foreign Application Priority Data

Feb. 24, 1996 [DE] Germany ............... 196 06 986.6

[51] Int. Cl.$^6$ .................................................. G01K 27/42
[52] U.S. Cl. .................. 364/571.01; 364/571.01; 324/601
[58] Field of Search ................... 324/76.11, 76.12, 324/76.19, 76.22, 600, 601, 649, 650; 364/480–482, 487, 570, 571.01, 571.02, 571.04, 578

[56] References Cited

U.S. PATENT DOCUMENTS

| | | |
|---|---|---|
| 4,808,912 | 2/1989 | Potter et al. ............... 324/601 |
| 4,982,164 | 1/1991 | Schiek et al. . |
| 5,063,520 | 11/1991 | Klein ............... 364/512 |
| 5,121,063 | 6/1992 | Kerkow et al. ............... 364/571.05 |
| 5,175,698 | 12/1992 | Barbanell ............... 364/553 |
| 5,321,364 | 6/1994 | Nukiyama et al. . |
| 5,349,539 | 9/1994 | Moriyasu ............... 364/579 |
| 5,369,594 | 11/1994 | Huang et al. ............... 364/490 |
| 5,442,296 | 8/1995 | Schiek et al. ............... 364/571.01 |

*Primary Examiner*—Emanuel Todd Voeltz
*Assistant Examiner*—Craig Steven Miller
*Attorney, Agent, or Firm*—Hill & Simpson

[57] ABSTRACT

For measuring electronic devices under test with a network analyzer, the electronic devices to be embedded into a linear auxiliary network during their operation, as well as, during the measurement. First, system error correction data is determined for the network analyzer according to a known calibration method by connecting calibration standards. Then, the characteristic data for the auxiliary network to be used is determined and is linked with the system error correction data to form new error correction simulation data. Finally, in the subsequent measurement of devices under test connected to the network analyzer, this error correction simulation data is appropriately considered with the algorithm for system error correction that is present in the network analyzer, so that an auxiliary network virtually connected to the device under test is simulated.

12 Claims, 1 Drawing Sheet

METHOD FOR MEASURING ELECTRONIC DEVICES UNDER TEST WITH A NETWORK ANALYZER

BACKGROUND OF THE INVENTION

In the fabrication and quality conformance inspection of electronic networks, for example electronic components such as transistors, filters and the like, it is necessary to precisely measure these before they are built into devices. Network analyzers are particularly suited for measuring the characteristic data of such networks in a predetermined, broad frequency range. For example, the network analyzer can thereby be fashioned as reflectometer with only one measuring port. In general, however, it has two measuring ports and is constructed as a vector network analyzer for measuring the one-port or, respectively, two-port parameters of a device under test according to amount and phase (according, for example, to U.S. Pat. No. 4,982,164).

It is necessary for an exact measurement that the network analyzer be previously calibrated by connecting calibration standards. For example, three calibration standards, all parameters thereof being known, are successively connected to the measuring ports of the network analyzer and the scattering (S) parameters (transmission and reflection parameters) are respectively measured and stored in matrix form in a memory of the network analyzer. The system error correction data determined in matrix form in this way by calibration can then be taken into account according to an algorithm present in the network analyzer in the following measured value correction.

The electronic networks to be measured, for instance components, must often be embedded in a linear auxiliary network during operation and, thus, during measurement as well, that is, a component under test must be operated via a matching network during operation, for example at the input side and/or output side or some other auxiliary circuit required for the operation must be provided parallel to and/or in series with the component. A typical example is a transistor that is to be utilized in a high-frequency amplifier and that should have an impedance of 50 Ω at the input and output side. Since the input and output impedance of the transistor usually does not amount to 50 Ω, a corresponding matching circuit must be provided at the input and output. For the quality conformance test at the manufacturer of the amplifier, it is therefore meaningful to employ a test fixture in which these specific matching circuits are integrated. The characteristic data (for example, S-parameters) for the entire amplifier, including the matching circuit, are thus obtained when measuring a transistor introduced into such a test fixture with a calibrated network analyzer. The advantage of such measurements is that the given specifications for the overall amplifier need not be converted into tolerance limits for the unwired transistor but can be directly employed.

However, this basically advantageous, successive measuring of components in great unit numbers has the disadvantage that optimally identical test fixtures must be provided for a plurality of identical measuring locations of a test field and the respectively integrated matching circuits must adhere to tight tolerances. When, moreover, the same component is to be operated with different auxiliary circuits for different applications, then respectively separate test fixtures must be present for each of these applications. Dependent on the device under test and the area of application thereof, a plurality of different test fixtures must therefore be present in a testing field, and these must also be identical to one another with narrow tolerances. As a result thereof, such measurements become extremely complicated and expensive.

SUMMARY OF THE INVENTION

It is an object of the present invention to provide a method for measuring electronic devices under test with a network analyzer whereby such auxiliary circuits required for the operation of the devices can be taken into account in a simple way.

In general terms the present invention is a method for measuring electronic devices under test with a network analyzer. The electronic devices are embedded in a linear auxiliary network during operation and during measurement. System error correction data is determined for the network analyzer according to a known calibration method by connecting calibration standards. The characteristic data for the auxiliary network to be used is determined and linked with the system error correction data to form new error correction simulation data. In the subsequent measurement of devices under test connected to the network analyzer, this error correction simulation data is appropriately considered with the algorithm for system error correction that is present in the network analyzer, so that an auxiliary network virtually connected to the device under test is simulated.

Advantageous developments of the present invention are as follows.

Both the system error correction data of the calibration standards, as well as, the characteristic data of the auxiliary network are determined in chain transfer matrix form. They are linked by multiplication to form a new error correction simulation matrix that is then stored in the network analyzer and taken into consideration in the subsequent measurement of a device under test.

The characteristic data of the auxiliary network are determined by measurement at a concretely constructed auxiliary network.

The characteristic data of the auxiliary network is calculated with a known network simulation program.

The following steps are used for measuring electronic components that are inserted during measurement into a test fixture into which a matching network required during operation of the components is integrated. The error correction data for the internal and external terminals of the test fixture is determined by a known calibration method. The characteristic data of the test fixture is determined from the difference between these internal and external error correction data. Finally, the characteristic data of the matching network itself is determined from the difference of the characteristic data of the test fixtures with and without matching network.

It is known in and of itself for determining the optimum dimensioning of a matching circuit that should precede a device under test to first measure the scattering parameters of the device with a network analyzer in a first measuring step and to thus then calculate the parameters of the matching circuit that enable an optimum matching on a computer in a second method step (U.S. Pat. No. 5,321,364). A determination of system error correction data of the network analyzer and linking thereof with the data of the matching circuit is thereby not provided.

In the inventive method, the auxiliary circuit required in the operation of the device under test is not concretely realized but is only simulated during the measurement. The characteristic data of the auxiliary circuit, which are either acquired by measurement at a concretely constructed auxiliary circuit specimen or are calculated by a known simulation program, are directly linked with the system error correction data of the network analyzer in the inventive method. In the following measurement of the device under test, which is no longer embedded into a concretely constructed auxiliary network but directly connected to the test ports of the network analyzer, the measured data nonetheless derive such after the system error correction as though the auxiliary network were present. The auxiliary network is thus only simulated and the measurement ensues with an auxiliary network virtually interconnected with the device under test. Only universal test fixtures in which no auxiliary circuits are integrated are thus required in the aforementioned application of quality conformance testing. Any arbitrary auxiliary circuit can thus be taken into consideration at an arbitrary plurality of measuring locations with utmost precision when measuring arbitrary devices under test. For changing an auxiliary circuit, it suffices to load a different simulation dataset into the network analyzer and to operate it with the system error correction data stored therein to form a new matrix.

The surprising advantage of the inventive method is to be especially seen therein that the algorithm for system error correction already implemented in the network analyzer is used for this virtual consideration of a matching network, after which a corresponding correction of the measured values is implemented without additional calculating outlay per frequency step, namely so fast that practically realtime measurements can thus be implemented. The data required for the simulation of the auxiliary network are taken into account in the measurement simultaneously with the system error correction data and the measuring time is thereby thus not lengthened.

What is understood by "characteristic data" of the auxiliary network are all standard matrix presentations, that is, for example, standard current/voltage matrices or standard wave matrices in scattering parameter (S) or chain transfer parameter (T) presentation. The same is true of the presentation of the system error correction data; all of these known matrix forms are also suitable therefor. It is especially advantageous to present both the system error correction data, as well as, the characteristic data of the auxiliary network in chain transfer (T) matrix form, since the new error correction/ simulation matrix can thus be directly determined in a simple way by multiplication of the original system error correction (T)-matrix by the inverse T-matrix of the auxiliary network.

In the simplest case, the characteristic data of the auxiliary circuit can be calculated according to a known simulation program such as disclosed, for example, in the operating manuals of the program Super Compact of the Compact Software company. With such a known simulation program, the behavior of an arbitrary high-frequency circuit can be simulated, for example, via a flow of the current input into the program and can be presented as S-matrix or T-matrix. Such a matrix acquired by calculation can then be directly operated with the system error correction matrix.

In practice, however, the optimum dimensioning of such an auxiliary circuit cannot always be purely synthetically determined by calculation, particularly given extremely high frequencies, since parasitic quantities of the auxiliary circuit are not considered in such simulation programs. It is advantageous in such cases to concretely construct an auxiliary circuit required for a specific device under test as a model auxiliary network and to then experimentally measure this model auxiliary network and identify the characteristic data of the auxiliary circuit in this way, these then being computationally operated again with the system error correction data of the calibration. Such a direct measurement of the characteristic data of an auxiliary network at a corresponding model is especially advantageous when the auxiliary circuit is, for example, already integrated in an existing test fixture and can then no longer be measured as an isolated circuit. In this case, there is the possibility of determining the T-parameters of the test fixture with a calibration of the inner and outer ports of the test fixture and subsequent quotient formation. On the basis of a further quotient formation between the T-parameters of the test fixture with auxiliary network and of the fixture without auxiliary network, this auxiliary circuit can thus be determined in isolation and then be in turn used for the operation with the system error correction data.

For the operation of the two matrices, it is necessary to place these into the same form. When the system error correction data are present, for example, in chain transfer matrix form and the data of the auxiliary circuit are present, for example, in chain matrix form, the chain matrix is converted into the chain transfer matrix form by a converter and the two matrices of the same type are then operated to form a new chain transfer matrix that is then in turn stored in the memory of the network analyzer.

The inventive method is also advantageous in the development of high-frequency circuits since arbitrary devices under test can be operated here with arbitrary simulated auxiliary circuits. By an appropriate, simulated modification of the auxiliary circuit, the development of circuit modules or components can thus be greatly simplified and facilitated.

In the inventive method, it is also possible to modify the data of the auxiliary circuit in successive measurements in order, for example, to thus determine the influence of differently dimensioned auxiliary circuits on the device under test. Ideally, the software for the determination of the data of the auxiliary network can be run on the network analyzer and is integrated in a common operator surface of the network analyzer, so that the user of the network analyzer can quickly and simply implement the inventive method.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
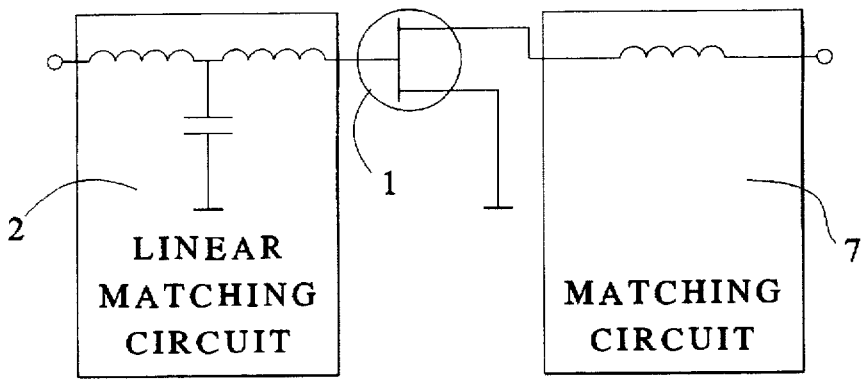
FIG. 1 shows a transistor connected to matching circuits.

FIG. 1 shows the schematic diagram of a transistor 1 to which a linear matching circuit 2 is connected at the input side and a matching circuit 7 is connected at the output side during operation. In addition to the calculatable circuit parts, these matching circuit have parasitic effects that cannot be unambiguously computationally acquired. In this example, thus, the matching circuit 2 and 7 cannot be exactly calculated.

Figure 2:
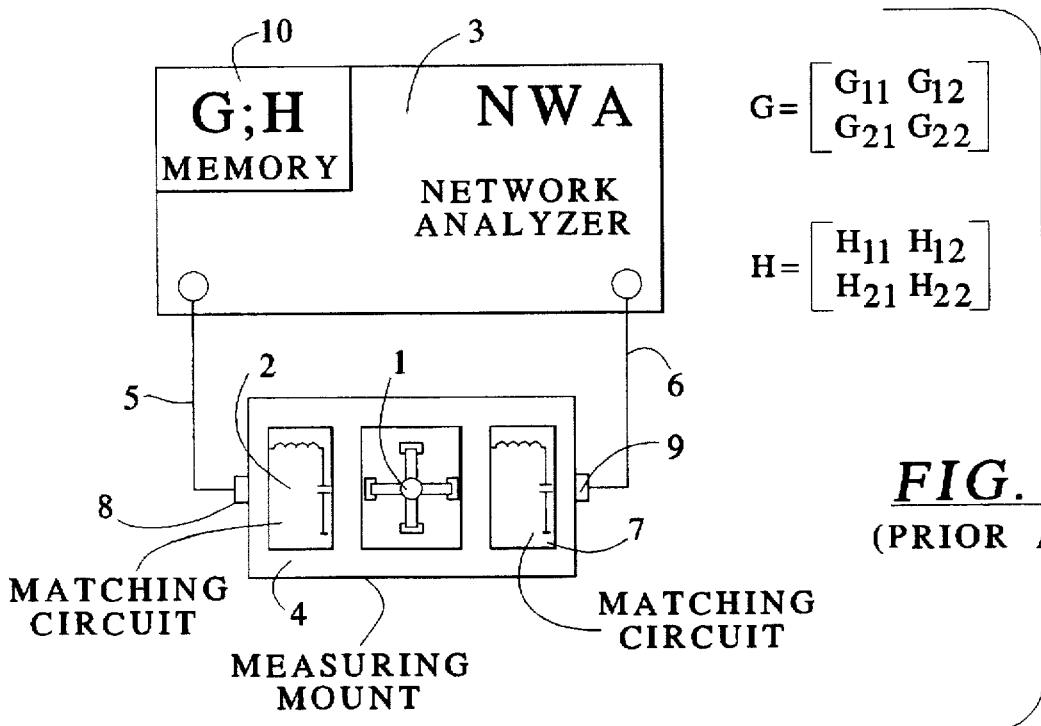
FIG. 2 shows a prior art system.

FIG. 2 shows a known measuring location for measuring such components as employed in quality conformance testing. The measuring location is composed of a vector network analyzer 3 and of a test fixture 4 that is connected via coaxial cables 5 and 6 to the test ports of the network analyzer and into which the component to be tested, for example the transistor 1 of FIG. 1, can be introduced. The matching circuits 2 and 7 are also built into the test fixture 4.

For calibration of the network analyzer 3, calibration standards are first connected between the coaxial terminals 8 and 9 instead of the device under test. The system error correction data acquired in this way are stored in a memory 10 of the network analyzer 3, for example in the form of T-matrices G and H for the two test ports. Subsequently, the test fixture 4 is then connected between the coaxial terminals 8 and 9 and the inserted transistor 1 together with the matching circuits 2 and 7 is measured. A plurality of transistors are successively measured in this way. A different test fixture 4 with different matching circuits 2 and 7 must be connected when a different transistor type is to be measured or a transistor is to be operated with a different matching circuit during its later operation. A plurality of different test fixtures 4 are therefore required at a measuring location. When, for example ten such measuring locations are present in a measuring field, this plurality of test fixtures must also be present ten times and must also be identically constructed within relatively narrow tolerances.

Figure 3:
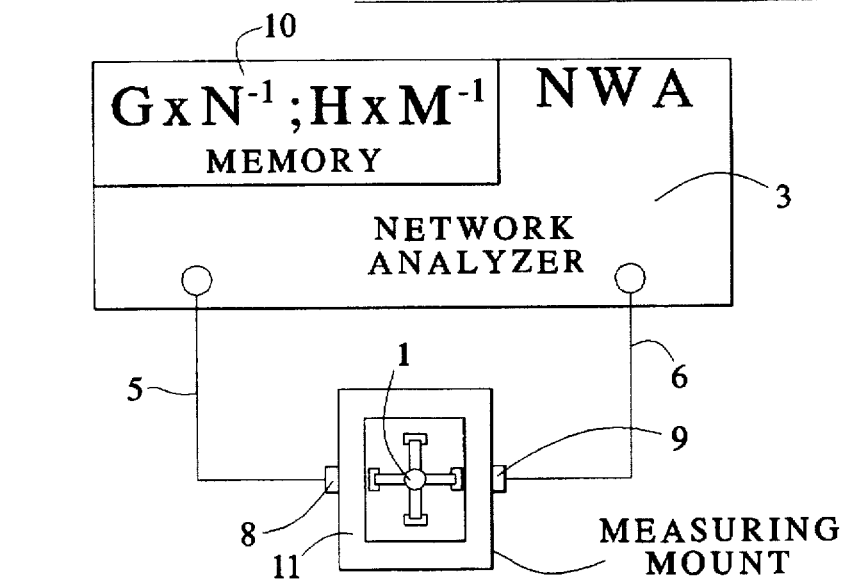
FIG. 3 shows the present invention.

This expensive maintaining of respectively specifically dimensioned test fixtures 4 is avoided according to the inventive measuring structure of FIG. 3. Only one universal test fixture 11 is provided here, this being the same for all measuring locations and also not containing any matching circuits. The test fixture 11 is directly connected to the network analyzer 3. The characteristic data of the matching circuits given the measuring structure of FIG. 3 are determined either by a prior measurement or by calculation and are operated with the system error correction data of the network analyzer 3 and stored in the memory 10. When the characteristic data of the matching circuit are referenced N and M as chain transfer matrices for the two test ports of the network analyzer, then the operation with the system error correction matrices G and H can be acquired by simple multiplication of the original error correction matrices G and H with the inverse N and M matrices of the matching circuits and can be stored in the memory 10 of the network analyzer. Given the measurement of the transistor 1 at a measuring location according to FIG. 3, thus, the respective raw measured values of the transistor 1 per frequency point are successively corrected at, for example, 400 measuring points with the system error algorithm present in the network analyzer, whereby the matching circuit is simultaneously virtually considered.

When a test fixture 4 with integrated matching circuits 2 and 7 shown in FIG. 2 is already present as a model, then the characteristic data of these matching circuits 2 and 7 can be determined in a simple way as follows.

First, the network analyzer is calibrated with reference to the external terminals 8 and 9 of the test fixture by inserting calibration standards between the coaxial lines 5 and 6. According to FIG. 2, the model test fixture 4 is then connected between the coaxial lines 5 and 6 and corresponding calibration standards are inserted into the contact socket of the test fixture 4 that accepts the transistor later. The error correction data for the internal terminals of the test fixture 4 are determined in this way. The quotient between these error correction data of the external terminals 8, 9 and the internal terminals of the test fixture 4 is then formed. According to FIG. 3, a universal test fixture 11 is subsequently connected to the network analyzer instead of the test fixture 4, and the difference between the data of the test fixture 4 with matching networks 2,7 and the test fixture 11 without matching network is determined. The characteristic data of the matching networks 2 and 7 can thus be determined, these then being operated with the system error correction data of the network analyzer to form the new error correction simulation data.

The invention is not limited to the particular details of the method depicted and other modifications and applications are contemplated. Certain other changes may be made in the above described a method without departing from the true spirit and scope of the invention herein involved. It is intended, therefore, that the subject matter in the above depiction shall be interpreted as illustrative and not in a limiting sense.

What is claimed is:

1. A method for measuring electronic devices under test with a network analyzer, said electronic devices being embedded in a linear auxiliary network during operation and during measurement, comprising the steps of:

determining system error correction data for the network analyzer according to a known calibration method by connecting calibration standards;

determining characteristic data for the auxiliary network and linking the characteristic data with the system error correction data to form new error correction simulation data; and using in subsequent measurement of devices under test connected to the network analyzer, said new error correction simulation data with an algorithm for system error correction that is present in the network analyzer, so that an auxiliary network virtually connected to the device under test is simulated.

2. The method according to claim 1, wherein both the system error correction data of the calibration standards, as well as, the characteristic data of the auxiliary network are determined in chain transfer matrix form and are linked by multiplication to form the new error correction simulation matrix that is then stored in the network analyzer and taken into consideration in subsequent measurement of a device under test.

3. The method according to claim 1, wherein the characteristic data of the auxiliary network is determined by measurement at a model auxiliary network concretely constructed.

4. The method according to claim 3, wherein the method is used for measuring electronic components that are inserted during measurement into a test fixture into which a matching network required during operation of the components is integrated;

wherein the error correction data for the internal and external terminals of the test fixture is determined by a known calibration method;

wherein the characteristic data of the test fixture is therewith determined from a difference between said internal and external error correction data; and wherein, the characteristic data of the matching network itself is determined from a difference of the characteristic data of the test fixtures with and without the matching network.

5. The method according to claim 1, wherein the characteristic data of the auxiliary network is calculated with a known network simulation program.

6. A method for measuring electronic devices under test with a network analyzer, said electronic devices being embedded in a linear auxiliary network during operation and during measurement, comprising the steps of:

determining system error correction data in chain transfer matrix form for the network analyzer according to a known calibration method by connecting calibration standards;

determining characteristic data in chain transfer matrix form for the auxiliary network and linking by multiplication the inverse characteristic data with the system error correction data to form new error correction simulation data that is stored in the network analyzer; and using in subsequent measurement of devices under test connected to the network analyzer, said new error correction simulation data with an algorithm for system error correction that is present in the network analyzer, so that an auxiliary network virtually connected to the devices under test is simulated.

7. The method according to claim 6, wherein the characteristic data of the auxiliary network is determined by measurement at a fixed auxiliary network.

8. The method according to claim 7, wherein the method is used for measuring electronic components that are inserted during measurement into a test fixture into which a matching network required during operation of the components is integrated;

wherein the error correction data for the internal and external terminals of the test fixture is determined by a known calibration method;

wherein the characteristic data of the test fixture is therewith determined from a difference between said internal and external error correction data; and wherein, the characteristic data of the matching network itself is determined from a difference of the characteristic data of the test fixtures with and without the matching network.

9. The method according to claim 6, wherein the characteristic data of the auxiliary network is calculated with a known network simulation program.

10. A method for measuring electronic components with a network analyzer, the electronic components being inserted during measurement into a test fixture into which a matching network required during operation of the components is integrated, comprising the steps of:

determining system error correction data for the network analyzer according to a known calibration method by connecting calibration standards;

determining internal and external error correction data for internal and external terminals of the test fixture by a known calibration method;

determining characteristic data of the test fixture from a difference between said internal and external error correction data, the characteristic data of the matching network itself being determined from a difference of the characteristic data of the test fixtures with and without the matching network;

determining characteristic data for the auxiliary network at a fixed auxiliary network and linking the characteristic data with the system error correction data to form new error correction simulation data;

using in subsequent measurement of devices under test connected to the network analyzer, said new error correction simulation data with an algorithm for system error correction that is present in the network analyzer, so that an auxiliary network virtually connected to the device under test is simulated.

11. The method according to claim 10, wherein both the system error correction data of the calibration standards, as well as, the characteristic data of the auxiliary network are determined in chain transfer matrix form and are linked by multiplication to form the new error correction simulation matrix that is then stored in the network analyzer and taken into consideration in subsequent measurement of a device under test.

12. The method according to claim 10, wherein the characteristic data of the auxiliary network is calculated with a known network simulation program.

* * * * *